US009385654B2

(12) United States Patent (10) Patent No.: US 9,385,654 B2
Englund et al. (45) Date of Patent: Jul. 5, 2016

(54) HIGH-PRECISION GHZ CLOCK GENERATION USING SPIN STATES IN DIAMOND

(71) Applicants: THE TRUSTEES OF COLUMBIA UNIVERSITY IN THE CITY OF NEW YORK, New York, NY (US); PRESIDENT AND FELLOWS OF HARVARD COLLEGE, Cambridge, MA (US)

(72) Inventors: Dirk R. Englund, New York, NY (US); Jonathan Hodges, Princeton, NJ (US); Mikhail D. Lukin, Cambridge, MA (US); Norman Y. Yao, Basking Ridge, NJ (US)

(73) Assignees: THE TRUSTEES OF COLUMBIA UNIVERSITY IN THE CITY OF NEW YORK, New York, NY (US); PRESIDENT AND FELLOWS OF HARVARD COLLEGE, Cambridge, MA (US)

(*) Notice: Subject to any disclaimer, the term of this patent is extended or adjusted under 35 U.S.C. 154(b) by 30 days.

(21) Appl. No.: 14/208,198

(22) Filed: Mar. 13, 2014

(65) Prior Publication Data

US 2014/0247094 A1 Sep. 4, 2014

Related U.S. Application Data

(63) Continuation of application No. PCT/US2012/055555, filed on Sep. 14, 2012.

(60) Provisional application No. 61/535,808, filed on Sep. 16, 2011, provisional application No. 61/693,416, filed on Aug. 27, 2012.

(51) Int. Cl.
*G01R 33/02* (2006.01)
*H03B 17/00* (2006.01)
(Continued)

(52) U.S. Cl.
CPC ............ *H03B 17/00* (2013.01); *G01R 33/1284* (2013.01); *G04F 5/14* (2013.01); *H03L 7/00* (2013.01); *H03L 7/26* (2013.01)

(58) Field of Classification Search
USPC ......................................... 324/115, 131, 520
See application file for complete search history.

(56) References Cited

U.S. PATENT DOCUMENTS 3,694,656 A 9/1972 Henning
5,037,376 A 8/1991 Richmond et al.
(Continued)

FOREIGN PATENT DOCUMENTS

WO WO 94/06152 A1 3/1994
WO WO 2008/128051 A2 10/2008
(Continued)

OTHER PUBLICATIONS

Draganski et al. (On the Opto-Elecrrical Properties of Ion-Implanted Single-Crystal Diamond in the Visible and Near-Visible Regime; Mar. 2011; https://researchbank.rmit.edu.au/eserv/rmit:160121/Draganski.pdf.*

(Continued)

*Primary Examiner* — Tung X Nguyen
*Assistant Examiner* — Alesa Allgood
(74) *Attorney, Agent, or Firm* — Baker Botts L.L.P.

(57) ABSTRACT

Techniques for obtaining a frequency standard using the crystal field splitting frequency of nitrogen vacancy center in diamond are disclosed. In certain exemplary embodiments, a microwave field is applied to the diamond and optically exciting the diamond under green light. The photoluminescent response of the diamond is measured by a photodetector. The intensity of the photoluminescent response can be used to determine the phase shift between the microwave and the crystal field splitting frequency. The microwave field frequency can be adjusted until the phase shift is below a predetermined threshold, and the microwave frequency can then be output for use as a standard.

23 Claims, 8 Drawing Sheets

(51) Int. Cl.
*G01R 33/12* (2006.01)
*H03L 7/26* (2006.01)
*H03L 7/00* (2006.01)
*G04F 5/14* (2006.01)

(56) References Cited

U.S. PATENT DOCUMENTS

| | | | |
|---|---|---|---|
| 5,173,761 | A | 12/1992 | Dreifus et al. |
| 5,307,146 | A | 4/1994 | Porter et al. |
| 7,030,704 | B2 | 4/2006 | White |
| 7,166,463 | B2 | 1/2007 | Karpen et al. |
| 7,190,993 | B2 | 3/2007 | Sharma et al. |
| 7,196,782 | B2 * | 3/2007 | Fielden et al. ............... 356/72 |
| 7,619,485 | B2 | 11/2009 | DeNatale et al. |
| 7,655,376 | B2 | 2/2010 | Anderson et al. |
| 7,776,296 | B2 | 8/2010 | Vuckovic et al. |
| 7,869,708 | B2 | 1/2011 | Evangelides, Jr. et al. |
| 8,110,898 | B2 | 2/2012 | Lewis et al. |
| 2003/0052080 | A1 | 3/2003 | Baik et al. |
| 2004/0079280 | A1 | 4/2004 | Lee et al. |
| 2004/0213534 | A9 | 10/2004 | Matsuura et al. |
| 2005/0088248 | A1 * | 4/2005 | White ................. G04F 5/14 331/94.1 |
| 2005/0118349 | A1 | 6/2005 | Whitehead et al. |
| 2005/0152429 | A1 | 7/2005 | Scherer |
| 2006/0134600 | A1 | 6/2006 | Fuhr et al. |
| 2006/0241236 | A1 | 10/2006 | Kuznetsov et al. |
| 2006/0265039 | A1 | 11/2006 | Bartic et al. |
| 2007/0048731 | A1 | 3/2007 | Colicos et al. |
| 2007/0126312 | A1 | 6/2007 | Sung |
| 2007/0216424 | A1 | 9/2007 | Sieh et al. |
| 2008/0096308 | A1 * | 4/2008 | Santori et al. ............... 438/105 |
| 2008/0299565 | A1 | 12/2008 | Schneider et al. |
| 2008/0319290 | A1 | 12/2008 | Mao et al. |
| 2009/0115029 | A1 | 5/2009 | Koyama et al. |
| 2009/0140275 | A1 * | 6/2009 | Santori et al. ............... 257/98 |
| 2009/0171233 | A1 | 7/2009 | Lanfermann et al. |
| 2009/0233445 | A1 | 9/2009 | Lee et al. |
| 2010/0016732 | A1 | 1/2010 | Wells et al. |
| 2010/0084634 | A1 | 4/2010 | Gamo et al. |
| 2010/0135890 | A1 | 6/2010 | Boudou et al. |
| 2010/0181534 | A1 | 7/2010 | Shenderova et al. |
| 2010/0233820 | A1 | 9/2010 | Pantazis et al. |
| 2010/0298600 | A1 | 11/2010 | Lee |
| 2010/0305309 | A1 | 12/2010 | Ho et al. |
| 2010/0315079 | A1 * | 12/2010 | Lukin et al. ............... 324/244.1 |
| 2010/0320475 | A1 | 12/2010 | Speck et al. |
| 2010/0328299 | A1 | 12/2010 | Yamazaki et al. |
| 2011/0062957 | A1 | 3/2011 | Fu et al. |
| 2011/0120890 | A1 | 5/2011 | Macpherson et al. |
| 2011/0163291 | A1 | 7/2011 | Scarsbrook et al. |
| 2011/0177008 | A1 | 7/2011 | Manus et al. |
| 2011/0309265 | A1 | 12/2011 | Babinec et al. |
| 2012/0000415 | A1 | 1/2012 | D'Evelyn et al. |
| 2012/0019242 | A1 | 1/2012 | Hollenberg et al. |
| 2013/0334170 | A1 | 12/2013 | Englund et al. |
| 2014/0100472 | A1 | 4/2014 | Englund et al. |
| 2014/0191139 | A1 | 7/2014 | Englund et al. |
| 2014/0247094 | A1 | 9/2014 | Englund et al. |

FOREIGN PATENT DOCUMENTS

| | | | | |
|---|---|---|---|---|
| WO | WO 2010/051580 | * | 5/2010 | ............. G01N 24/00 |
| WO | WO 2011/102474 A1 | | 8/2011 | |
| WO | WO 2012/034924 | | 3/2012 | |
| WO | WO 2013/066446 | | 5/2013 | |

OTHER PUBLICATIONS

International Search Report and Written Opinion for PCT/US12/27235, dated Jun. 13, 2012.
U.S. Appl. No. 13/973,499, Oct. 8, 2014 Non-Final Office Action.
U.S. Appl. No. 14/227,076, filed Mar. 27, 2014.
International Search Report and Written Opinion for PCT/US12/042255, dated Sep. 14, 2012.
International Search Report and Written Opinion for PCT/US12/048830, dated Apr. 5, 2013.
International Search Report and Written Opinion for PCT/US12/060735, dated Jan. 7, 2013.
International Search Report and Written Opinion for PCT/US12/055555, dated Jan. 23, 2013.
International Search Report and Written Opinion for PCT/US14/020565, dated Jun. 23, 2014.
International Search Report and Written Opinion for PCT/US13/045795, dated Nov. 14, 2013.
International Search Report and Written Opinion for PCT/US13/045631, dated Nov. 14, 2013.
Aichele et al., "Assembly of Fundamental Photonic Elements from Single Nanodiamonds", 23$^{rd}$ Annual Meeting of the IEEE Photonics Society, Denver, CO, pp. 142-143 (2010).
Boudou et al., "High Yield Fabrication of Fluorescent Nanodiamonds", Nanotechnology, 20:235602 (11 pages) (2009).
Bradac et al., "Observation and Control of Blinking Nitrogen-Vacancy Centres in Discrete Nanodiamonds", Nature Nanotechnology, 5:345-349 (2010).
Catledge et al., "Strong Narrow-Band luminescence from Silicon-Vacancy Color Centers in Spatially Localized Sub-10 nm Nanodiamond", Advanced Science Letters. 4(2):512-515 (2011).
Chang et al., "Mass Production and Dynamic Imaging of Flourescent Nanodiamonds", Nature Nanotechnology, 3:284-287 (2008).
Cheung et al., "Implantable Microscale Neural Interfaces", Biomed Microdevices, 9:923-938 (2007).
DeNatale et al., "Compact, Low-Power Chip-Scale Atomic Clock", Position, Location and Navigation Symposium 2008 IEEE, pp. 67-70 (2008).
Draganski et al., "On the Opto-Electrical Properties of Ion-Implanted Single-Crystal Diamond in the Visible and Near-Visible Regime", RMIT University, Mar. 2011, pp. 1-277 [retrieved on Jan. 10, 2012] Retrieved from the internet: URL:http://researchbank.rmit.edu.au/eserv/rmit:160121/Draganski.pdf.
Englund et al., "Deterministic Coupling of a Single Nitrogen Vacancy Center to a Photonic Crystal Cavity", Nano Letters, 10:3922-3926 (2010).
Fu et al., "Characterization and Application of Single Fluorescent Nanodiamonds as Cellular Biomarkers", PNAS, 104(3):727-732 (2007).
Han et al., "Three-Dimensional Stimulate Emission Depletion Microscopy of Nitrogen-Vacancy Centers in Diamond Using Continuous-Wave Light", Nano Letters, 9(9):3323-3329 (2009).
Liu et al., "Plasmon-Enhanced Photoluminescence from Bioconjugated Gold Nanoparticle and Nanodiamond Assembly", Applied Physics Letters, 98:153702-153705 (2011).
Maletinsky et al. "A Robust Scanning Diamond Sensor for Nanoscale Imaging with Single Nitrogen-Vacancy Centres", Nature Nanotechnology, 7(5):320-324 (2012).
Manson et al., "Nitrogen-Vacancy Center in Diamond: Model of the Electronic Structure and Associated Dynamics", Physical Review B, 74:104303 (11 pages) (2006).
Qing et al., "Nanowire transistor arrays for mapping neural circuits in acute brain slices", PNAS, 107(5):1882-1887 (2010).
Schietinger et al., "Plasmon-Enhanced Single Photon Emission from a Nanoassembled Metal-Diamond Hybrid Structure at Room Temperature", Nano Letters, 9(4):1694-1698 (2009).
Seker et al., "The fabrication of low-impendance nanoporous gold multiple-electrode arrays for neural electrophysiology studies", Nanotechnology, 21(12):125504 (13 pages) (2010).
Shahriar "(QC Theme) Type-Two Quantum Computing in PBG-Based Cavities for Efficient Simulation of lattice Gas Dynamics", Northwestern University. (62 pages) Final Report Apr. 26, 2008.
Smirnov et al. "Aligned Diamond Nano-Wires: Fabrication and Characterization for Advanced Applications in Bio- and Electrochemistry", Diamond and Related Materials 2009 [retrieved on Jun. 3, 2014). Retrieved from the internet: <URL: http://www.soft-hummingbird.com/Proggis/PTD/(2010)%20-%20Smimov"/o20-%20Diamond%20Nanowires%20(drrn).pdf> entire document.
Yamanaka et al., "SAX Microscopy with Fluorescent Nanodiamond Probes for High-Resolution Fluorescence Imaging", Biomedical Optics Express, 2(7):1946-1953 (2011).

(56) References Cited

OTHER PUBLICATIONS

Zou et al. "Fabrication of Diamond Nanopillars and Their Arrays", Applied Physics, letters 92, 053105 (2008).
U.S. Appl. No. 13/973,499, Apr. 7, 2015 Response to Non-Final Office Action.
U.S. Appl. No. 13/973,499, Jun. 17, 2015 Final Office Action.
U.S. Appl. No. 14/150,412, Jan. 2, 2015 Non-Final Office Action.
U.S. Appl. No. 14/150,412, Jun. 2, 2015 Response to Non-Final Office Action.
U.S. Appl. No. 14/150,412, Aug. 28, 2015 Notice of Allowance.
Behr, D. et al., "Lift-off technique of homoepitaxial CVD diamond films by deep implantation and selective etching", Diamond and Related Materials, Elsevier Science Publishers, Amsterdam, NL, vol. 6, No. 5-7, Apr. 1, 1997, pp. 654-657, XP004081116, ISSN: 0925-9635, DOI: 10.1016/S0925-9635(96)00662-0.
Balasubramanian, et al., "Nanoscale imaging manetometry with diamond spins under ambient conditions", *Nature*, vol. 455, No. 7213, Oct. 2, 2008, pp. 648-651, XP055182320.
Hunn, J.D. et al., "Ion Beam and Laser-Assisted Micromachining of Single-Crystal Diamond", Solid State Technology, Pennwell Corporation, Tulsa, Ok, US, vol. 37, No. 12, Dec. 1, 1994, pp. 57-60, XP000485595, ISSN: 0038-111X.
Manus, et al., "Gd(III)-Nanodiamond Conjugates for MRI Contrast Enhancement", Nano Letters, vol. 10, No. 2, Feb. 10, 2010, pp. 484-489, XP55190250.
McGuinness, et al., "Quantum measurement and orientation tracking of fluorescent nanodiamonds inside living cells", *Nature Nanotechnology*, vol. 6, No. 6, May 8, 2011, pp. 358-363, XP55182222.
Neumann P., et al., "Excited-state spectroscopy of single NV defects in diamond using optically detected magnetic resonance", New Journal of Physics, Institute of Physics Publishing, Bristol, GB, vol. 11, No. 1, 2009, p. 13017-1 to 13017-10, XP020154302.
Steinert S., et al., "High sensitivity magnetic imaging using an array of spins in diamond", Review of Scientific Instruments, AIP, Melville, NY, US, vol. 81, No. 4, Apr. 23, 2010, pp. 43705-1 to 43705-5, XP012134958.
Tisler, Julia, et al., "Highly Efficient FRET from a Single Nitrogen-Vacancy Center in Nanodiamonds to a Single Organic Molecule", ACS Nano, vol. 5, No. 10, Sep. 7, 2011, pp. 7893-7898, XP055182326.
EP Search Report mailed May 8, 2015 in EP Patent Application No. 12 84 2617.
Supplementary European Search Report mailed Jun. 22, 2015 in EP Application No. 12846188.
European Extended Search Report dated Jan. 23, 2015 in EP Application No. 12752171.
U.S. Appl. No. 13/973,499, Jan. 15, 2016 Non-Final Office Action.
U.S. Appl. No. 13/973,499, Dec. 7, 2015 Amendment and Request for Continued Examination (RCE).
U.S. Appl. No. 14/104,931, Sep. 10, 2015 Non-Final Office Action.
U.S. Appl. No. 14/150,412, Nov. 24, 2015 Issue Fee Payment.
U.S. Appl. No. 14/841,922 (US 2016/0052789), filed Sep. 1, 2015 (Feb. 25, 2016).
U.S. Appl. No. 14/952,216 (US 2016/0077004), filed Nov. 25, 2015, Mar. 17, 2016.
U.S. Appl. No. 14/952,216, Apr. 4, 2016, Final Office Action.
U.S. Appl. No. 14/952,216, Mar. 16, 2016 Response to Non-Final Office Action.
U.S. Appl. No. 14/952,216, Dec. 16, 2015 Non-Final Office Action.

* cited by examiner

HIGH-PRECISION GHZ CLOCK GENERATION USING SPIN STATES IN DIAMOND

CROSS-REFERENCE TO RELATED APPLICATIONS

This application is a continuation of International Application No. PCT/US12/055555 filed Sep. 14, 2012, which claims priority to U.S. Provisional Application Ser. No. 61/535,808, filed Sep. 16, 2011, and U.S. Provisional Application Ser. No. 61/693,416, filed Aug. 27, 2012 the disclosures of which are each hereby incorporated by reference in their entirety.

STATEMENT OF FEDERALLY SPONSORED RESEARCH OR DEVELOPMENT

This invention was made with government support under Grant No. FA9550-11-0014, awarded by the Air Force Office of Scientific Research. The government has certain rights in the invention.

BACKGROUND

The disclosed subject matter relates to techniques for providing a frequency standard using spin states of a defect in a diamond structure.

Atomic clocks can serve as the basis for accurate systems in use for measuring time and frequency. They can be utilized in a number of applications, including communication, computation, mobile devices, sensors, autonomous vehicles, undersea oil/gas exploration, space navigation, aviation, cruise missiles, and navigation systems (e.g. global positioning systems (GPS)).

Certain frequency standards can derive their stability from hyperfine level splitting of energy states in atoms such as Cs, Rb, or H. When an oscillating magnetic field is resonant with the energy difference of these internal states, a change in population between levels changes the radiofrequency or optical absorption. Certain techniques can modulate the driving frequency and monitor the absorption as a correction for a tunable active reference oscillator, e.g. a quartz crystal, thus stabilizing it to the atomic line.

Single trapped ions and ensembles of atoms trapped in optical lattices can provide a frequency standard with accuracy exceeding the international cesium standard, and can enable the observation of general relativity corrections within a few meters. Such techniques, however, can require infrastructure that encompasses several tens of cubic meters of space.

Portable standards based on rubidium vapor cells can provide stability for time scales ranging from 1 s to $10^4$ s and can be used in connection with satellites, laboratory equipment, and cellular communications. Mobile devices, which may not contain their own precision standards, can share GPS time signals for maintaining communication standards, but when the external lock signal is obstructed, a precise local frequency standard with minimal drift can be necessary to maintain synchronization.

Accordingly, there is a need for improved techniques for providing a frequency standard for time-keeping.

Nitrogen Vacancy Centers (NVC) are point defects in the diamond crystal structure. The substitution of a nitrogen atom for a carbon atom in the diamond structure can create a lattice vacancy that can be occupied by three unpaired electrons. In a neutral nitrogen vacancy defect, $N-V^0$, two of the unpaired electrons can form a quasi covalent bond, while the third electron remains unpaired. However, the three electrons can exhibit axial symmetry, and the three continuously exchange roles. A negative nitrogen vacancy, $N-V^-$, can have an additional electron associated with the vacancy which forms an S=1 structure that has a long-lived spin triplet in its ground state that can be probed using optical and microwave excitation. This can allow for spin manipulation of the NVC.

The NVC can have trigonal $C_{30}$ symmetry and $3A^2$ ground state with total electronic spin S=1. Spin-spin interaction can lead to a zero-field splitting between the ms=0 and ms=±1 manifolds, where the quantization axis is along the NV-axis. NVCs can have a crystal field splitting frequency ($D_{gs}$) of, for example, 2.870 GHz in the absence of an external magnetic field and in the absence of other environmental factors, including strain. This zero-field splitting frequency can be changed by the application of magnetic fields in the direction of the NVC through the Zeeman effect.

SUMMARY

In one aspect of the disclosed subject matter, a method of obtaining a frequency standard from the crystal field splitting frequency of a nitrogen vacancy center in a diamond structure is provided. In one embodiment, the method can include applying an initial, adjustable microwave field to a diamond structure. Optical excitation of the diamond structure can produce a detectable photoluminescent response, with that response being modulated in intensity by the frequency of the microwave field being applied. From the modulation of the photoluminescent response, the phase shift between the microwave field and the crystal field splitting frequency of the nitrogen vacancy center in the diamond structure can be determined. The frequency of the microwave field can be adjusted until the detected phase shift is below a predetermined threshold. That microwave frequency then can be used as the frequency standard.

In certain embodiments, the microwave field frequency can be tested continuously, even after the original determination of the frequency standard, to prevent drift of the frequency standard.

In one embodiment, an ensemble of nitrogen vacancy centers can be optically excited and probed with the microwave field to find the frequency standard. The use of multiple nitrogen vacancy centers can provide additional accuracy in the measurement of the frequency standard.

In another embodiment, a sequence of light and microwave pulses can be used. For example, the diamond structure can be first subjected to optical pumping to drive the spin state of a plurality of nitrogen vacancy centers to the |0⟩ state. After optical pumping ceases, a first microwave pulse of flip angle π/4 can be applied to the diamond structure. After a time T, a second microwave pulse of flip angle π can be applied in the opposite phase of the first pulse. After a second time T, a third microwave pulse identical to the first microwave pulse can be applied. Following the third microwave pulse, the transient fluorescent response of the diamond structure can be measured by applying an optical pulse. The measurement of the transient fluorescent response can be used to calculate the phase shift of the initial microwave pulse frequency from the crystal field splitting frequency.

In an embodiment, two diamond structures can be tested at the same time in order to stabilize the measurements against temperature dependence. In another embodiment, a single diamond structure can be placed in a clamp to engineer strain upon the diamond structure, in order to stabilize the measurements against temperature dependence.

In another aspect of the disclosed subject matter, a system for obtaining a frequency standard based on the crystal field splitting frequency of nitrogen vacancy centers in a diamond structure is provided. One exemplary system can include a dielectric cavity adapted to at least partially encompass the diamond structure, a light source configured to optically excite the nitrogen vacancy center and thereby allow the nitrogen vacancy center to emit a photoluminescent response, a photodetector configured to detect photoluminescence, a stripline configured to emit a microwave field upon the diamond structure, a processor to calculate the phase shift between the microwave emission frequency and the crystal field splitting frequency of the nitrogen vacancy center in the diamond structure, and a controller to adjust the frequency of the microwave emissions.

In an embodiment, the photodetector can be a silicon photodiode. The dielectric cavity can include a pair of Bragg reflectors placed on opposite sides of the diamond structure and outside the plane of the stripline for microwave emissions. The Bragg reflectors can create a 532 nm resonant cavity encompassing the diamond structure. The light source can be a surface emitting laser adapted for generation of a doubled 1064 nm beam.

In an embodiment, the light source and the microwave stripline can be configured to apply pulsed emissions upon the diamond structure. The photodetector can be configured to measure the photoluminescent response after an optical pulse.

In an embodiment, two diamond structures can be placed in two systems in the dielectric cavity, the light source, the photodetector, and the stripline. The processor can be configured to detect the phase shift for both diamond structures and thereby stabilize the measurements for temperature dependence. In a further embodiment, the two diamond structures can be clamped to two substrates with different thermal expansion coefficients. The diamond structure can be coupled to a single clamp to engineer strain upon the diamond structure.

Figure 1:
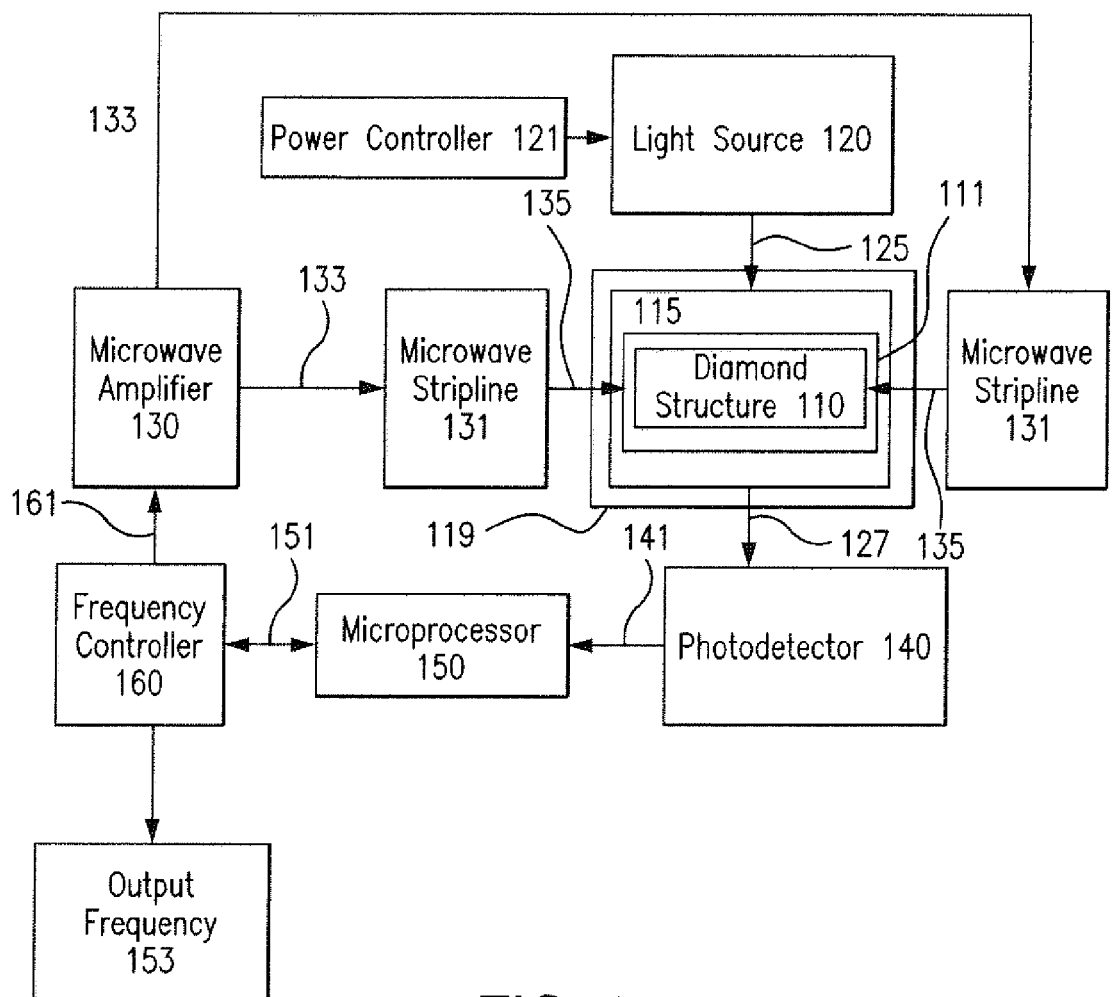
FIG. 1 is a schematic diagram of a system for obtaining a frequency standard from spin states of defects in a diamond structure according to an embodiment of the disclosed subject matter.

Throughout the drawings, the same reference numerals and characters, unless otherwise stated, are used to denote like features, elements, components or portions of the illustrated embodiments. Moreover, while the disclosed subject matter will now be described in detail with reference to the Figs., it is done so in connection with the illustrative embodiments.

DETAILED DESCRIPTION

Techniques for providing a frequency standard using spin states of a defect in a diamond structure are disclosed herein. Diamond structures can have many desirable characteristics for providing a frequency standard. For example, a single crystal diamond can be grown into a micron-scale, radiation hard chip, which makes it portable and well-suited for integration in a semiconductor fabrication process. Additionally, a frequency standard derived from the spin lifetime of the nitrogen vacancy center (NVC) can resemble atomic and molecular systems. The optical detection of the NVC can also increase the signal-to-noise ratio for a solid-state standard. A sufficiently high density of NVCs in a chip can allow for comparable frequency stability in smaller sensor volumes.

In one aspect of the disclosed subject matter, techniques for obtaining a frequency standard from the crystal field splitting frequency of a nitrogen vacancy center in a diamond structure can include continuously applying an initial, adjustable microwave field to a diamond structure concurrently with optical excitation to produce a detectable photoluminescent response. In another aspect of the disclosed subject matter, techniques for obtaining a frequency standard from the crystal field splitting frequency of a nitrogen vacancy center in a diamond structure can include a pulsed technique, applying one or more microwave pulses to a diamond structure, and then observing the transient photoluminescent response by applying an optical pulse. In yet another aspect of the disclosed subject matter, techniques for obtaining a frequency standard from the crystal field splitting frequency of a nitrogen vacancy center in a diamond structure can include using temperature stabilization techniques to improve the accuracy of the frequency standard.

An exemplary embodiment of a system for obtaining a frequency standard using spin states of defects in diamond will now be described with reference to FIG. 1. and FIG. 4, for purposes of illustration and not limitation.

A diamond chip containing NVCs 110 on a substrate 119 can be exposed to optical and microwave emissions. The diamond chip can be grown onto the substrate, for example, via chemical vapor deposition (CVD). Alternatively, a prefabricated diamond chip can be implanted on or integrated with the substrate. The photoluminescent (PL) response from the optical excitation can be detected using a photodetector 140 and the phase shift between the microwave emission and the field-splitting frequency, $D_{gs}$, of the NVC can be determined using a processor 150.

The optical emissions can be created by a light source 120 arranged to illuminate one face of the diamond chip. The light source can be configured to produce, for example a laser beam 125 having a specific power level 121 and a specific wavelength 123. In one embodiment, the light source can be configured to produce a 1064 nm laser that is doubled prior to interacting with the diamond chip 125. Alternatively, the light source can be configured to produce approximately a 520-550 nm laser, and in certain embodiments can be configured to produce a 520 nm laser.

A dielectric cavity 115 can be placed around the diamond chip 110 to lower the power requirements for the laser beam 125. The dielectric cavity can be formed for example by a pair of Bragg reflectors, which can create a 532 nm resonant cavity around the diamond chip 110. One of the Bragg reflectors can be placed between the diamond chip 110 and the light source 120 and the second reflector can be placed on the opposite side. The Bragg reflectors can be made of a quarter wave stack of materials with different reflective indices, using for example, materials such as silicon dioxide, titanium dioxide, tantalum pentoxide, or the like. This can allow the laser beam 125 to resonate within the cavity and can cause optical excitation of the NVCs in the diamond chip 110.

Figure 4:
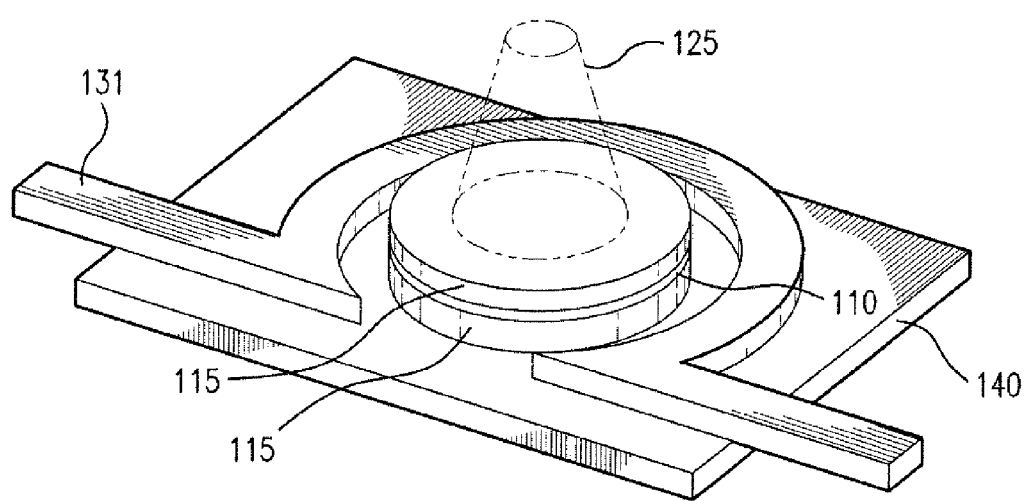
FIG. 4 is a depiction of a system for obtaining a frequency standard from spin states of defects in a diamond structure according to an embodiment of the disclosed subject matter.

The microwave field can be created by a planar stripline 131 that can encircle the diamond chip 110 on a single plane as seen in FIG. 4. Alternatively, the microwave field can be created by other suitable techniques, for example with other geometries and suitable antennas. The microwave cavity can also be fitted with reflectors to create a resonant cavity 111 for microwave emissions, for example at 2.87 GHz. A frequency controller 160 can determine the frequency of the microwave emissions based on input data from a microprocessor 150, and can report the frequency back to the microprocessor 151.

The optical emissions can excite the NVCs, to produce a photoluminescent (PL) response 127. NVCs can absorb green light and emit a PL response between, for example, 637-800 nm. As described in more detail below, the intensity of the PL response can correspond to the polarization of the spin states of the NVC, which can depend on the frequency of the microwave field. Thus, the processor 150 can determine, based on a signal from the photodetctor 140, when the PL response corresponds to an applied microwave field equal to a known field-splitting frequency of the NVC, and thus can lock the frequency controller 160 at such a frequency, thereby providing a frequency standard.

Exemplary embodiments of techniques for providing a frequency standard using spin states of a defect in diamond will be described in detail below. For purposes of illustration, and not limitation, the level structure and fluorescent properties of the nitrogen vacancy, as they relate to exemplary and non-limiting bases for a frequency standard disclosed herein (e.g., the zero-field splitting of the NV as a frequency standard), will first be described. However, one or ordinary skill in the art will appreciate that certain properties of the NV center in diamond are well known, and the following description is not intended to limit or otherwise narrow the scope of the disclosed subject matter. Additionally, throughout the following description, certain characterizations of stability and quality factor will be described for purposes of illustration, and not limitation. One of ordinary skill in the art will appreciate that such characterizations are not intended to limit or otherwise narrow the scope of the disclosed subject matter, but are provided as an exemplary method of describing the techniques disclosed herein.

Atomic clocks, generally, can drive their stability from a large quality factor ("Q-factor"), which can be given as $Q=v/\Delta v$, of the probed resonance, with narrow linewidth, $\Delta v$, being smaller than the resonant frequency $v$. The NYC in diamond can have a ground state spin triplet characterized by long coherence times (for example, greater than 1 ms), a ground state crystal field splitting with an intrinsic resonance frequency near 2.870 GHz, which can be independent, to lowest order, of applied magnetic field, and spin states that are optically polarizable and detectable on single defect length scales (for example, approximately 1 µm).

Figure 5A:
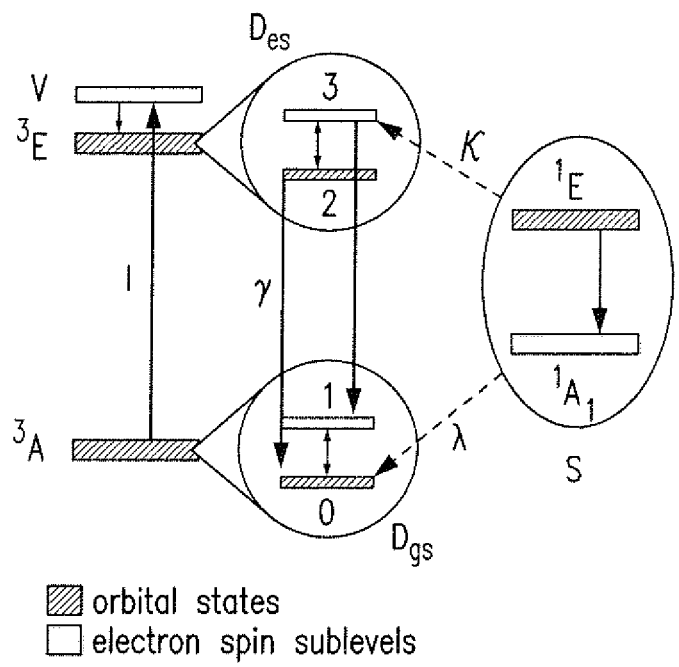
FIG. 5(a) is a diagram of certain spin sublevels for a nitrogen vacancy center in diamond.

With reference to FIG. 5(a), relevant spin sublevels of the NVC (0, 1, 2, 3 and S) are depicted. Optical absorption of green laser light can cause broadband photoluminescence (PL) of the NVC from, for example, 637-800 nm. A spin dependent intersystem crossing between the excited spin triplet 3 and the metastable, dark singlet level S can change the integrated PL for the spin states $|0\rangle$ and $|\pm1\rangle$. The deshelving from the singlet can occur primarily to the $|0\rangle$ spin state, providing a means to polarize the NVC. Microwave fields resonant between levels $|0\rangle$ and $|1\rangle$ can perturb the spin populations, and thus the PL response. This can be characterized, for example, in two ways: 1) by measuring a continuous wave response to simultaneous optical and microwave fields (for example, as demonstrated in FIG. 5(b), or 2) in a pulsed manner, by preparing a state using only microwaves, and observing the transient PL response.

For purposes of illustration, and not limitation, the relevant spin dynamics can be described by Hamiltonians for the lowest and first excited triplet state and two metastable singlet states. In an exemplary embodiment, as described below, the response of only the ground state triplet sublevels to resonant excitation can be monitored, yielding the ground state Hamiltonian:

$$H_{gs}=(D_{gs}+d_{\|}\sigma_z)S_z^2+g\mu_b\vec{S}\cdot\vec{B}+d_{195}\sigma_\perp(S_xS_y+S_yS_x)+d_\perp\sigma_\perp(S_z^2-S_y^2) \quad (1)$$

where $d_{\|,\perp}$ are the ground state electric dipole moment components along and perpendicular to the $C_{3u}$ symmetry axis of the defect. $D_{gs}$ is the ground state crystal field splitting frequency (e.g., 2.870 GHz), $\mu_b$ is the Bohr magnetron, and g is the Uncle factor (assumed to be isotropic). $S_k$ are spin-1 operators in the k={x, y, z} directions. The local electric field vector, induced by crystal strain, is $\vec{\sigma}$. In the limit of static magnetic and electric fields much smaller than $D_{gs}$, the eigenfunctions are those of the $S_z$ operator, as shown in FIG. 5.

A driving field at frequency ω can induce electron spin resonance (ESR) transitions between $|0\rangle$ and $|\pm1\rangle$. On resonance ($\omega\approx D_{gs}$), the PL response can decrease and can provide a feedback signal as to lock ω to $D_{gs}$. The dynamics can be viewed as a response to a time-varying magnetic field $B_1=2b_1\cos(2\pi\omega t)\hat{x}$; transforming $H_{gs}$ into an interaction frame defined by the operator $V=e^{2\pi i\omega tS_z^2}$. Under the rotating wave approximation, the Hamiltonian can be:

$$H_{gs}^1=(D_{gs}+d_{\|}\sigma_z-\omega)S_z^2+g\mu_bB_zS_z+g\mu_bb_1S_z. \quad (2)$$

The relaxation rates of the excited triplet and singlet states, shown in FIG. 5, can play a role in the optical pumping and spin measurement. The total magneto-optical response can be modeled using a master equation approach, such as for example:

$$\rho = \frac{1}{i\hbar}[H_{gs}^1, \rho] + \sum_k L_k \rho L_k^\dagger - \frac{1}{2} L_k^\dagger L_k \rho - \frac{1}{2} \rho L_k^\dagger L_k \quad (3)$$

where ρ is the density operator for the NVC ground, excited triplet, and effective singlet states. The jump operators, $L_k$, can have magnitudes corresponding to relaxation rates $\sqrt{T_k}$. The solution to the equation can yield the total magneto-optical response for both continuous and pulsed excitation.

Figure 2:
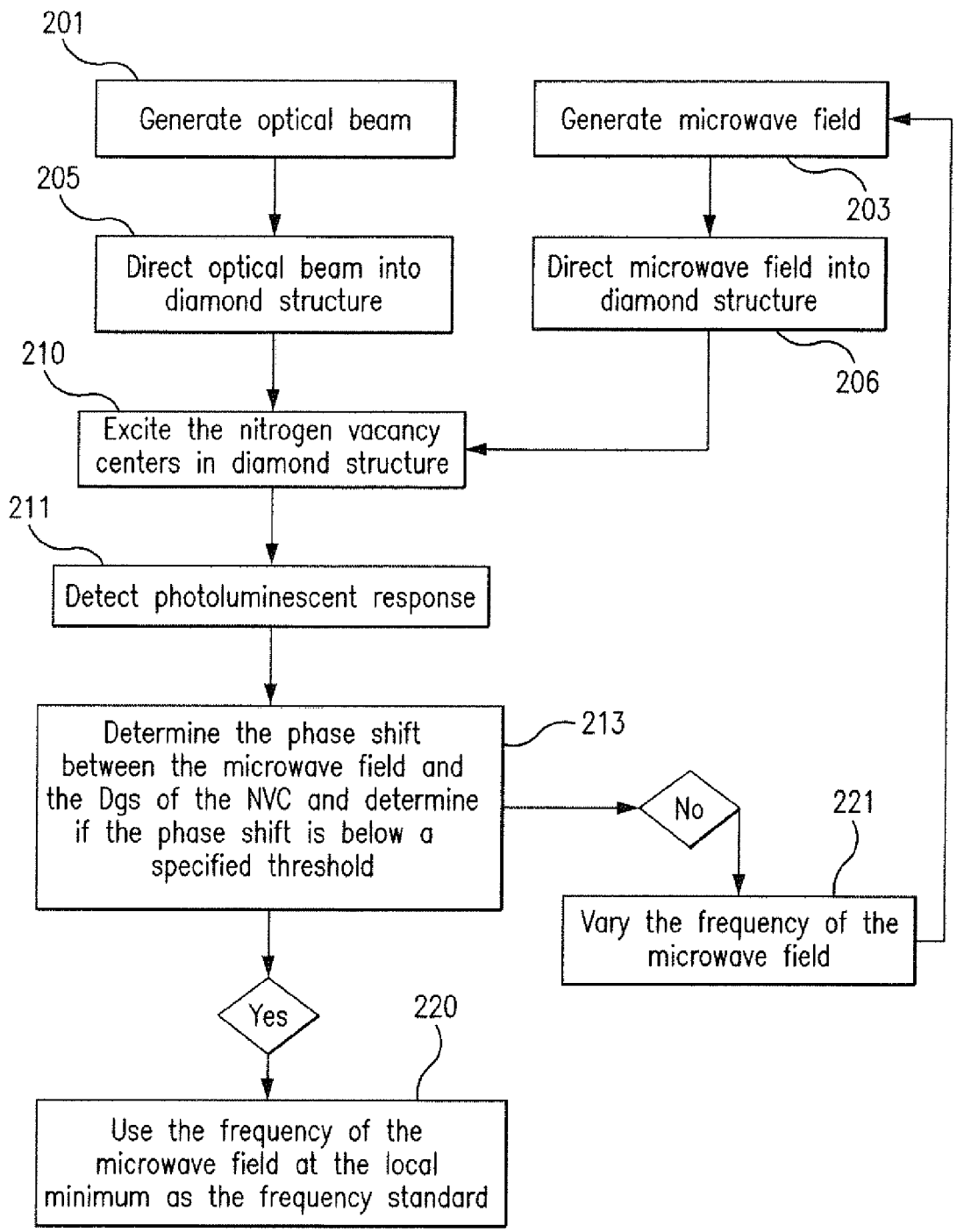
FIG. 2 is a flow diagram of a method for obtaining a frequency standard from spin states of defects in a diamond structure according to an embodiment of the disclosed subject matter.

A first exemplary embodiment of a technique for providing a frequency standard using spin states of a defect in diamond will now be described in detail, for purposes of illustration and not limitation, with reference to FIG. 2. In connection with this description, reference will be made to FIG. 1 for purposes of illustration and not limitation, as one of ordinary skill in the art will appreciate that certain variations to the system depicted therein can be used.

This exemplary technique, which can be referred to as a "Continuous Wave" (CW) technique, can include continuously applying an initial, adjustable microwave field to a diamond structure concurrently with optical excitation to produce a detectable photoluminescent response. In this embodiment, a diamond chip containing NVCs 110 on a substrate 119 can be exposed to optical emissions and exposed to microwave emissions concurrently and continuously. That is, an optical beam can be generated (201) and directed (205) to the diamond structure. Concurrently, a microwave field can be generated (203) and directed (206) to the diamond structure. The optical beam and microwave field can be generated and can have characteristics as described herein above in connection with FIG. 1.

Under continuous excitation by a microwave field of intensity $\Omega = g\mu_b b_1$, detuned from resonance of the NVC by an amount $\Delta = D_{gs} - \omega$, a broad, phonon-assisted PL response can occur following the equation:

$$PL: F(I, \Omega, \Delta) = \gamma \rho_{22}^{ss} + \frac{\gamma^2}{k + \gamma} \rho_{33}^{ss}. \quad (4)$$

Figure 5B:
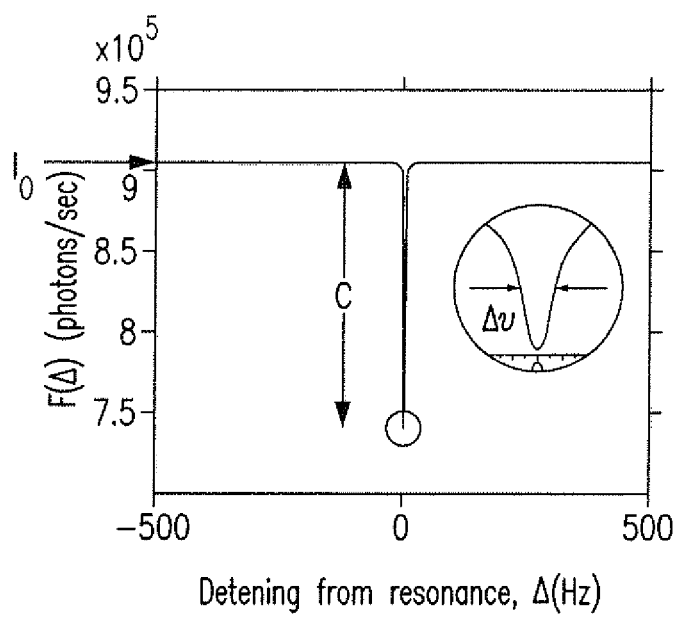
FIG. 5(b) is a graph of the steady-state fluorescence emission of a nitrogen vacancy center under continuous optical and microwave irradiation.

Here $\rho_{22}^{ss}$ and $\rho_{33}^{ss}$ can represent the population of the first excited state spin sublevels in the steady-state, as analytically derived from Equation 3. FIG. 5(b) shows an exemplary response for F for varied detunings, which can be approximated by the Lorentzian:

$$F(\Delta) = I_0 \left(1 - \frac{C\delta v^2}{(\Delta/\pi)^2 + \delta v^2}\right). \quad (5)$$

The PL response can be detected (211) using a photodetector 140. The photodetector can be, for example, a silicon photodiode placed adjacent to the diamond structure and opposite the light source. The photodiode can measure the intensity of the PL response and reports the intensity to the microprocessor 150.

By calculating the PL response, the phase shift Δ between the microwave field and $D_{gs}$ can be determined (215) by the processor 150 by using Equation 5. The frequency of the microwave field can be varied (221) by the controller 160 until the phase shift is determined to be below the predetermined threshold (213). The frequency of the microwave field at that point 153 can be used as a frequency standard (220).

The stability of the frequency standard can be given by a derivation from the resonance curve by considering the Allan variance:

$$\sigma_y(\tau) = \frac{1}{2\pi Q} \frac{1}{(S/N)} \frac{1}{\sqrt{\tau}} \quad (6)$$

where S/N is the signal to noise ratio, which can depend on both the photon shot noise as well as the imperfect modulation of the resonance (e.g., C≠1), and τ is the averaging time. The intrinsic linewidth can be limited by the paramagnetic and nuclear spin environments which fluctuate during the measurement. This linewidth can broaden if the microwave and optical transitions are driven near saturation; however, higher pump powers can also increase the depth of the dip (C→1). Far below optical saturation, the PL rate can be sufficiently small, and the modulation depth (C) reduced, so as to cause a decrease in the stability per averaging time. A condition can exist which balances line broadening with the reduced signal, and in accordance therewith, the linewidth can be approximately 3.6 MHz ($T_2^*$=88 ns), and off-resonance fluorescence rate can be approximately 9400 photon/s (accounting for a finite detector efficiency), and a 17% modulation depth. With these parameters, the Allan variance can be, for example, $\sigma_y(\tau) = 8.124 \times 10^{-5} \tau^{-1/2}$ for a single NVC. That is, the laser excitation can be reduced far below saturation so that optical power broadening can reach the homogeneous linewidth. At such low pump powers, the fluorescent photon flux can be small such that the gains in Q-factor can be reduced by losses in signal to noise ratio S/N.

Figure 3:
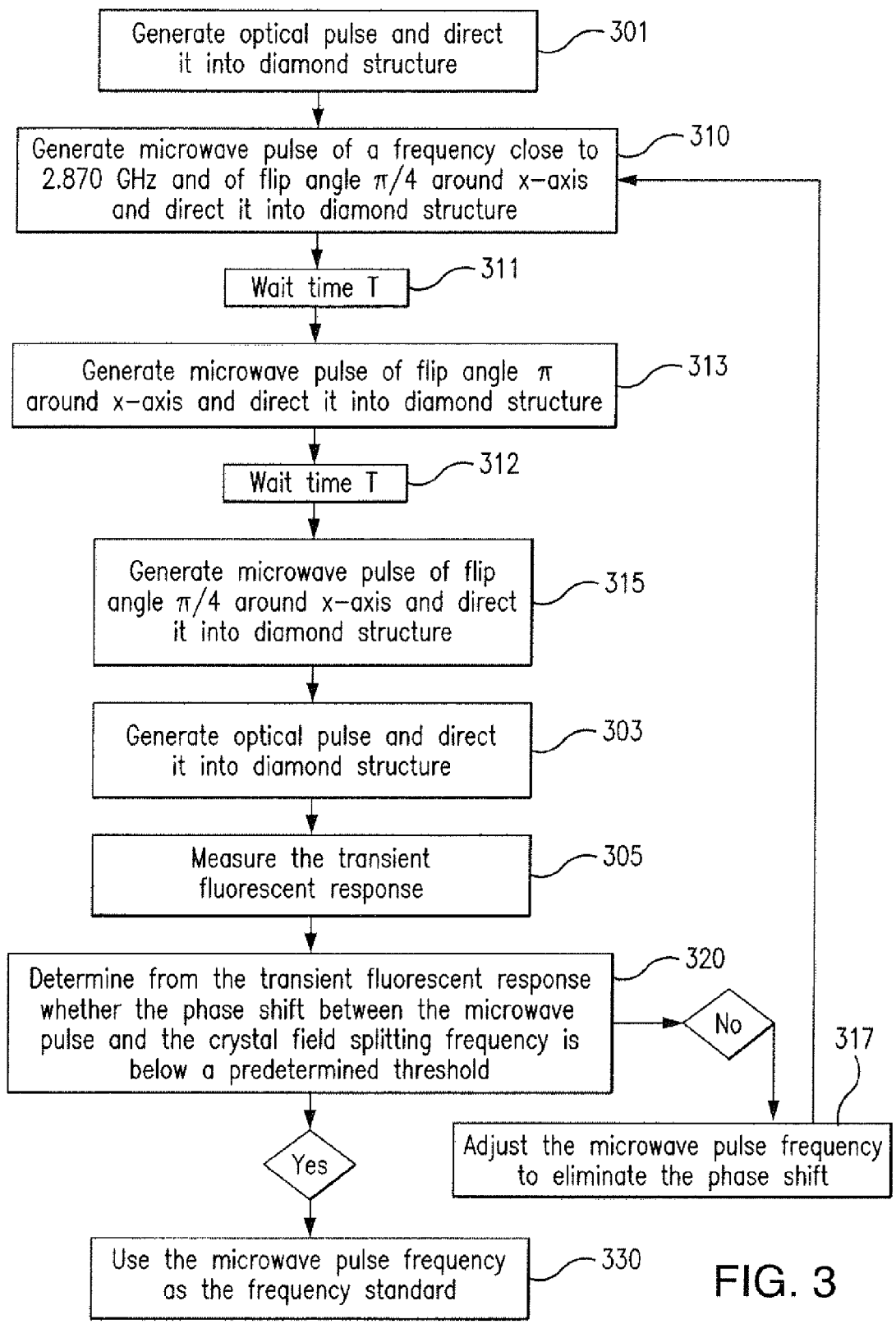
FIG. 3 is a flow diagram of a method for obtaining a frequency standard from spin states of defects in a diamond structure according to another embodiment of the disclosed subject matter.
Figure 6:
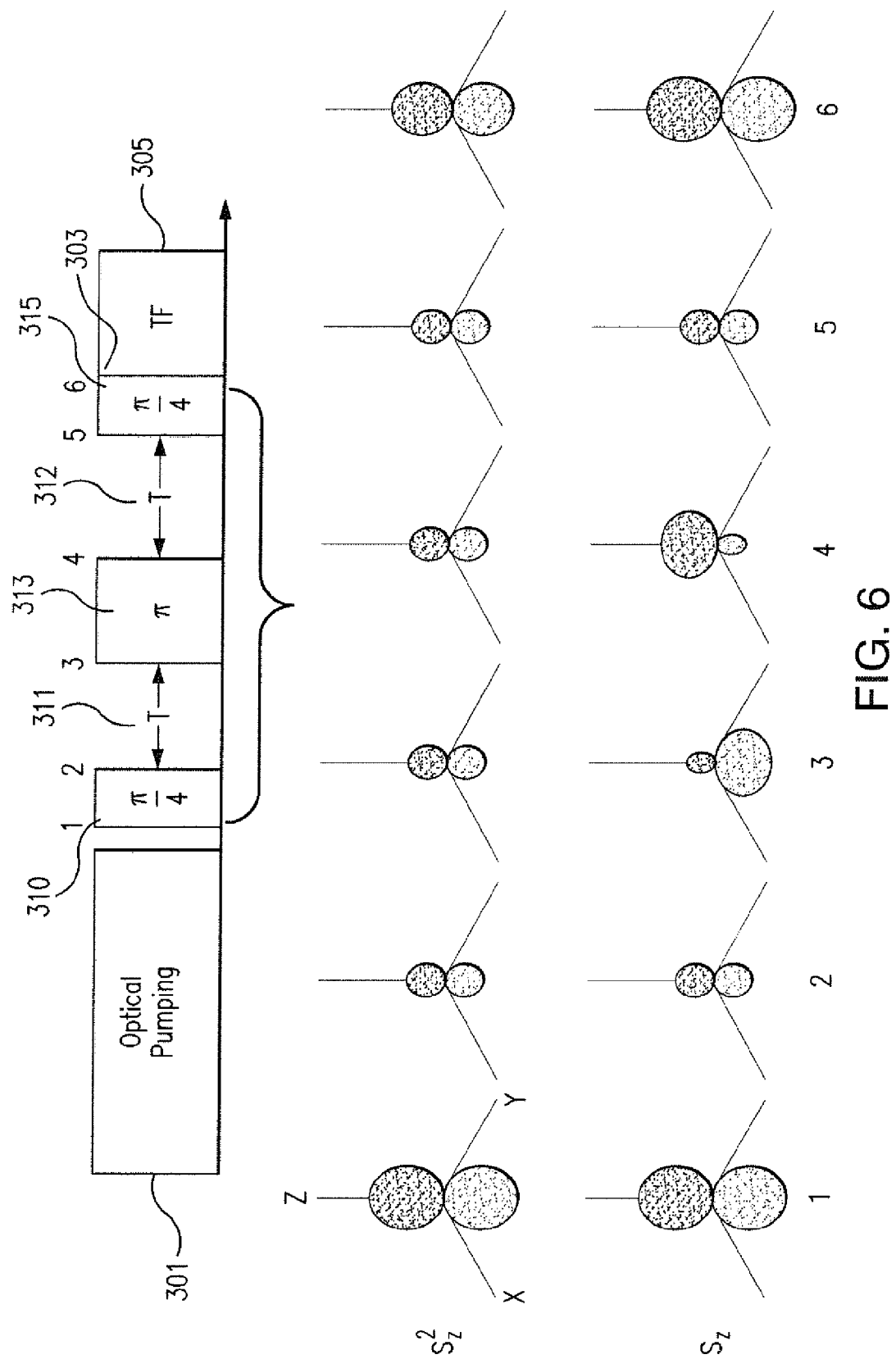
FIG. 6 is a diagram of a method for obtaining a frequency standard from spin states of defects in a diamond structure by exposing the diamond structure to pulses of optical and microwave emissions, and the expected spin states of the defect during the time the method is implemented.

A second exemplary embodiment of a technique for providing a frequency standard using spin states of a defect in diamond will now be described in detail, for purposes of illustration and not limitation, with reference to FIG. 3 and FIG. 6. In connection with this description, reference will be made to FIG. 1 for purposes of illustration and not limitation, as one of ordinary skill in the art will appreciate that certain variations to the system depicted therein can be used.

This exemplary technique, which can be referred to as a "pulsed" technique, can include continuously applying a pulsed microwave excitation scheme, which can monitor transient fluorescence behavior. In this embodiment, optical pumping of the NVC can first prepare the initial state $|\psi_0\rangle = |m_s=0\rangle$. This optical pumping can cease before microwaves are emitted. That is, an optical pulse can be generated (301) and directed to the diamond structure.

A modified Hahn echo sequence can be used to yield a PL response and eliminate the effects of external magnetic fields on the spin response. First, a microwave pulse with a frequency close to 2.870 GHZ and a flip angle of π/4 around the x-axis of the NVC can be generated (310). After waiting (311) a period T (which can be, for example, about 1 ms), a second microwave pulse can be generated (313). The time period T can be, for example, close to the electron spin coherence time, can be approximately 1 ms for high-purity diamond samples. This second pulse can have a flip angle of π. After waiting (312) a second period of time T, a third microwave pulse can be generated (315). This third pulse can be identical to the first pulse with a flip angle π/4. This modified Hahn echo sequence can extend the coherence time $T_c$ (which in the diamond NV can be approximately tens of microseconds) to approximately $T_2$ by, for example, removing slowly varying magnetic fields. In this manner, the modulation of the PL response can persist, as the Spin-1 nature of the NVC can allow for a PL signal proportional to the frequency drift. It should be noted that a conventional Hahn echo sequence can remove the phase accumulation associated with frequency drift with the additional π pulse therein.

Evolution under this drift echo sequence, $U_{echo}$, can follow the equation $$|\psi_f\rangle = U_{echo}|\psi_0\rangle = \frac{1}{\sqrt{2}}\sin(\phi)|0\rangle - \frac{1}{2}\cos(\phi)(|+1\rangle + |-1\rangle), \quad (7)$$

where $\phi=(D_{gs}-w)T=\delta wT$. A transient fluorescence measurement can be recorded (305) immediately following the third pulse. For example, the response can be measured by recording the photocurrent with the photodetector 140 for about 300 ns timed with a pulse of green light (303) from the light source 120. In certain embodiments, the timing can be shorter than the electron spin reset time, which can be for example between approximately 200 ns and approximately 500 ns.

The transient PL response of the NVC can be modeled, for example, using projective measurements. The operator M can describe the spin expectation value for a PL measurement, $\hat{M}=a|0\rangle\langle 0|+b(|+1\rangle\langle +1|+|-1\rangle\langle -1|)$, where a and b are independent Poisson random variables. The fractional frequency deviation can vary as the quantum observable, M for the state $|\omega_f\rangle$ according to:

$$\frac{\delta w}{w_0} = \frac{1}{w_0}\frac{\langle \Delta\hat{M}\rangle}{w_0|\partial\langle\hat{M}\rangle/\partial w|}, \quad (8)$$

where $\langle \Delta\hat{M}^2\rangle=\langle\hat{M}^2\rangle-\langle\hat{M}\rangle^2$ is the variance of the operator. For room temperature spin readout of the NVC, for example, 2a=3b. By calculating the moments of $\hat{M}$ and assuming the results for total time τ=M'T are accumulated, the following equation can be derived:

$$\left\langle\frac{\delta w}{w_0}\right\rangle_{M^1} = \frac{\xi}{D_{gs}\sqrt{T\tau}}, \quad (9)$$

with ξ≈5 due to a combination of imperfect spin readout (i.e. b≠0), inefficient collection of photons (i.e. a<<1), and a small ratio of shelving state to radiative lifetime (λ/γ).

The predetermined threshold for the phase shift for an ensemble of NVCs can be predetermined, for example, by multiplying the deviation for a single NVC, $8.8\times10^{-9}/\sqrt{\tau}$ by $1/\sqrt{N}$, where N is the number of NVCs. N can be estimated by taking the density of pure diamond, $1.74\times10^{23}$ C atoms/cm$^3$, with the NV$^-$ defect fraction at 0.01 parts per billion (ppb), which results in $\sim1.74\times10^{12}$ NVCs/cm$^3$. For a diamond chip of cross-section area of 1 mm$^3$ and a thickness of approximately 100 μm, this can result in a deviation of $2\times10^{-13}/\sqrt{\tau}$ in accordance with this exemplary technique. Thus, a diamond film with thickness of approximately 100 μm can give an Allen variance $\sigma_y^{pulsed} \sim 6.7\times10^{-13}\tau^{1/2}$.

If the determined phase shift is above the predetermined threshold (320), the microwave frequency can be adjusted (317) by the controller 160 and the pulse sequence can be repeated. If the determined phase shift is below the predetermined threshold (320), then the frequency of the microwave field determined by the processor 153 can be used as the frequency standard (330).

A third exemplary embodiment of a technique for providing a frequency standard using spin states of a defect in diamond will now be described in detail, for purposes of illustration and not limitation, with reference to FIG. 7. In this embodiment, techniques for obtaining a frequency standard from the crystal field splitting frequency of a nitrogen vacancy center in a diamond structure can include using temperature stabilization techniques to improve the accuracy of the frequency standard.

The resonance frequency corresponding to $D_{gs}$ of an NV center can vary as a function of temperature, θ. At room-temperature, $dD_{gs}/d\theta$ can be equal to approximately 74.2 kHz/K for mm-sized samples. At temperatures of approximately 5K, $dD_{gs}/d\theta$ can be equal to approximately 100 kHz/K, and at higher temperatures (up to approximately 600K), $dD_{gs}/d\theta$ can be equal to approximately 100 kHz/K. Thus, zero-field splitting temperature dependence can be nonlinear. This temperature dependence can be a result of thermal expansion of the diamond. For example, local lattice spacing of the NV center can be distorted, causing changes in the orbital overlaps which determine $D_{gs}$.

The temperature of the diamond chip can be stabilized, for example, using commercially available Peltier coolers with PID loops (for example to within 0.01K). This can allow, for example, 742 Hz uncertainty in the zero-field splitting, or a fraction frequency stability of approximately $2.58\times10^{-7}$ at room temperature. However, in this case, ensemble averaging would not increase certainty, as all NV centers can shift equally due to isotropic expansion.

In accordance with this exemplary embodiment, anisotropy can be induced in the crystal's temperature response. Two different dependences can be identified, and can be locked in a feedback loop to enhance temperature stability. In this embodiment, two or more "clocks" (that is, the subject matter described herein), can have different temperature dependences. Different temperature dependences can be achieved, for example, by utilizing two distinct diamond slabs mounted on substrates with different thermal expansion coefficients.

Figure 7A:
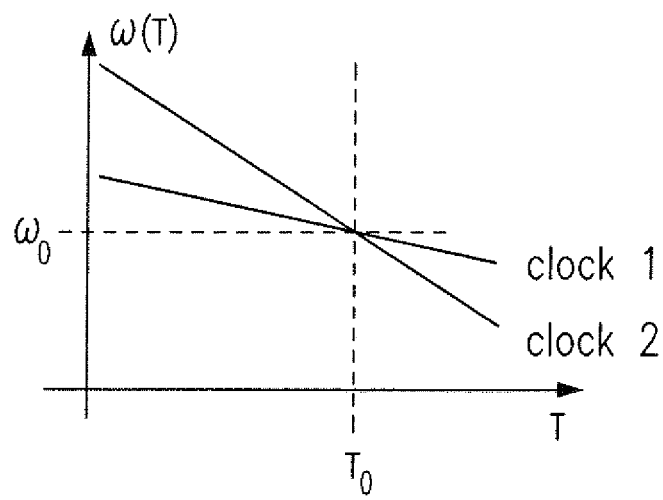
FIG. 7a is a chart illustrating the different temperature dependences for two different clamp materials.
Figure 7B:
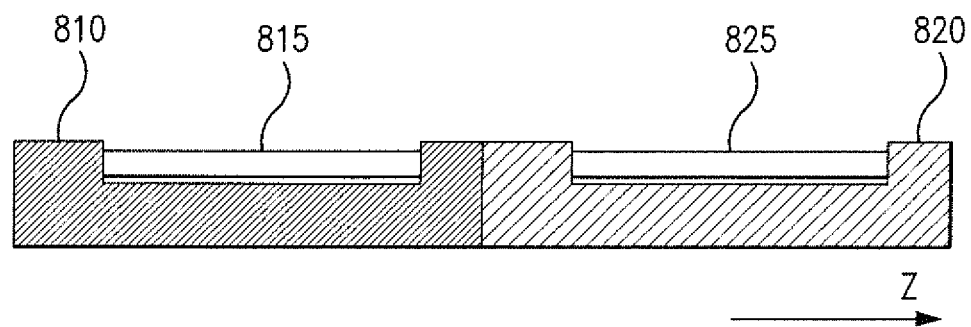
FIG. 7b is a diagram of the method for compensating for temperature dependence using two clamps.
Figure 7C:
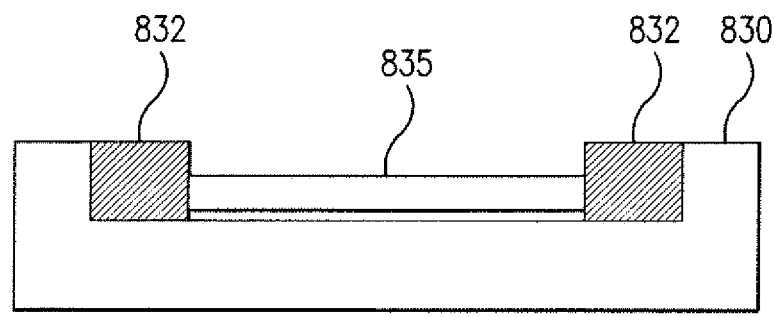
FIG. 7c is a diagram of the single-clamp method for controlling temperature dependence with engineered strain.

For example, and with reference to FIG. 7, two diamond chips 815 and 825 can be clamped into two different substrates 810 and 820. The substrates can have different thermal expansion coefficients. One diamond chip 815 can be clamped in a stiff material 810 with Young's modulus $E_1$ and a high thermal expansion coefficient $\eta_{c1}$. This material can be, for example, brass. The second diamond chip 825 can be clamped in a different material 820 with Young's modulus $E_2$ and a lower thermal expansion coefficient $\eta_{c2}$ where $\eta_{c2}<\eta_{c1}$. The second material can be, for example, tungsten. The cross-sectional area of the substrates can be much greater than that of the diamond chips. Both diamond chips and the substrates can be assumed to start at the same temperature θ. The change in strain imparted on the diamond can be approximated as $\Delta\epsilon_{1,2}\approx\eta_d(1+\eta_{c1,2}E_{c1,2}/E_d)\Delta\theta$, where Δθ is the temperature difference between the initial set-point $T_0$. This initial set-point can be determined at a point where the two clocks have the same initial frequency $\omega_0$ and can be adjusted by pre-loading strain within the samples, as seen in FIG. 7(a).

A conventional thermal feedback system using thermistors can maintain the system near $T_0$ within $\sim10^{-2}$-$10^{-3}$ K. To compensate for smaller temperature drifts, the different temperature dependencies of the two diamond chips can be exploited to yield the equations:

$$\omega_1(T)=\omega_0+\beta_1\Delta\theta \quad (10)$$

$$\omega_2(T)=\omega_0+\beta_2\Delta\theta \quad (11)$$

where $$\beta_{1,2} = \frac{d\varepsilon}{d\theta}\frac{dD_{gs}}{d\varepsilon} = \eta_d(1+\eta_{c1,2}E_{c1,2}/E_d)(dD_{gs}/d\varepsilon).$$

At time $\tau=0$, both clocks can be at the same temperature $\theta_0$, before the temperature is allowed to fluctuate within a small range around $\theta_0$. After time t, these clocks have acquired a phase:

$$\phi_{1,2}(t)=\omega_0 t+\int_0^t \beta_{1,2}\Delta\theta(t')dt' \pm \Delta\phi_0 \quad (12)$$

where $\Delta\phi_0 = \xi\sqrt{t}/\sqrt{\theta_{2,ens}N}$ is the phase uncertainty. The difference between the two phases can be recorded by mixing and low-pass filtering the two clock signals, giving $\Delta\phi(t)=\phi_2(t)-\phi_1(t)=\int_0^t \Delta\beta_{1,2}\Delta\theta(t')dt' \pm \sqrt{2}\Delta\phi_0$, where $\beta_{1,2}=\beta_2-\beta_1$ and an identical variance is assumed for $\phi_1(t)$ and $\phi_2(t)$.

The temperature fluctuations in clock '1' can be corrected as follows:

$$\begin{aligned}\phi_1'(t) &= \phi_1(t) - \int_0^t \beta_1 \Delta T(t')dt' \\ &= \phi_1(t) - \left(\int_0^t \beta_{1,2}\Delta T(t')dt'\right)\cdot\frac{\beta_1}{\Delta\beta_{1,2}} \\ &= \phi_1(t) - \frac{\beta_1}{\Delta\beta_{1,2}}(\Delta\phi(t) \mp \sqrt{2}\Delta\phi_0)\end{aligned} \quad (13)$$

The phase can be divided by t to yield the frequency, from which the uncertainty of the new "synchronized composite" after a time t:

$$\begin{aligned}\frac{\Delta\omega_1'}{\omega_1'} &= \frac{\xi}{\sqrt{T_2 Nt}\, D_{gs}}\left(1+2\left(\frac{\beta_1}{\Delta\beta_{1,2}}\right)^2\right)^{1/2} \\ &= \left(\frac{\Delta\omega}{\omega_0}\right)_{T=T_0}\left(1+2\left(\frac{\beta_1}{\Delta\beta_{1,2}}\right)^2\right)^{1/2}.\end{aligned} \quad (14)$$

Thus, the uncertainty can be reduced when the temperature dependencies of the two clocks can be large. For example, with reference to equation 14, when $\Delta\beta_2 \gg \beta_1$, the performance of the composite clock can be similar to that of a bare temperature-insensitive NV clock. While the phase difference can be directly computed and the clock frequency corrected digitally, the phase difference can also be used to stabilize the temperature, particularly where the two clocks can be maintained at a frequency difference, $v_{beat} \sim 10$ kHz, so that the beat frequency can be locked to a high Q ($\sim 10^6$) quartz oscillator.

In another exemplary embodiment, the temperature dependence can be resolved in a single diamond system through the use of engineered strain. Within the ground state Hamiltonian, as expressed in equation 1, the strain dependence can be hidden in the effective electric field vector, $\vec{\sigma}$. In terms of the actual components of the strain tensor $\in$, perturbation to the spin Hamiltonian can take the form $F_{ijkl}S_i S_j \in_{kl}$, where F is the forth order strain response tensor. Symmetries can reduce the number of allowed terms to eight totally symmetric combinations, and of these, only the terms with an $S_z^2$ coefficient can be considered. Thus, the strain dependence of the zero-field splitting can generally be characterized as:

$$(D_{gs}+A_1(\in_{xx}+\in_{yy})+A_2\in_{zz})(S_z^2-\tfrac{2}{3}), \quad (14)$$

where $A_1$ and $A_2$ are parameters which can require experimental input. In the case of isotropic expansion, $\in_{xx}=\in_{yy}=\in_{zz}$, $dD_{gs}/d\theta$ can be equal to $2A_1+A_2$. By clamping the diamond along a specific director, an anisotropic lattice response can significantly reduce the effective temperature dependence of the zero-field splitting.

Figure 8A:
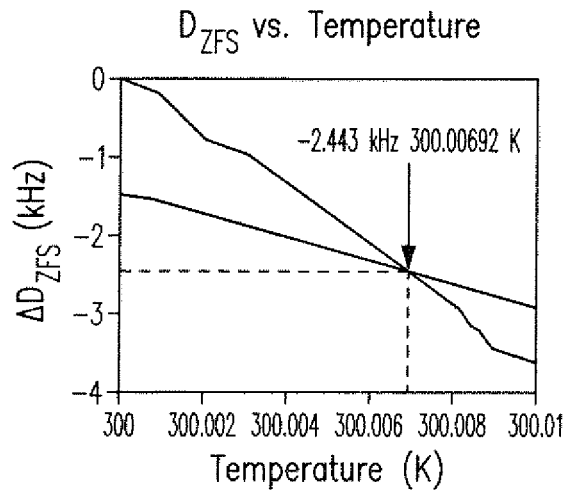
FIG. 8a is depicts simulation of the field splitting frequency of a nitrogen vacancy center as a function of temperature where the diamond structure has been clamped with a stiff material and where the diamond structure has been clamped with a softer material in accordance with an embodiment of the disclosed subject matter.
Figure 8B:
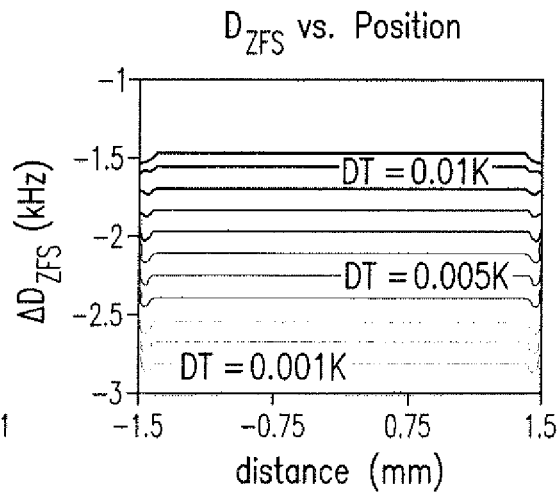
FIG. 8b depicts the relationship between spatial frequency variation and position within a clamped diamond disk in accordance with and embodiment of the disclosed subject matter.
Figure 8C:
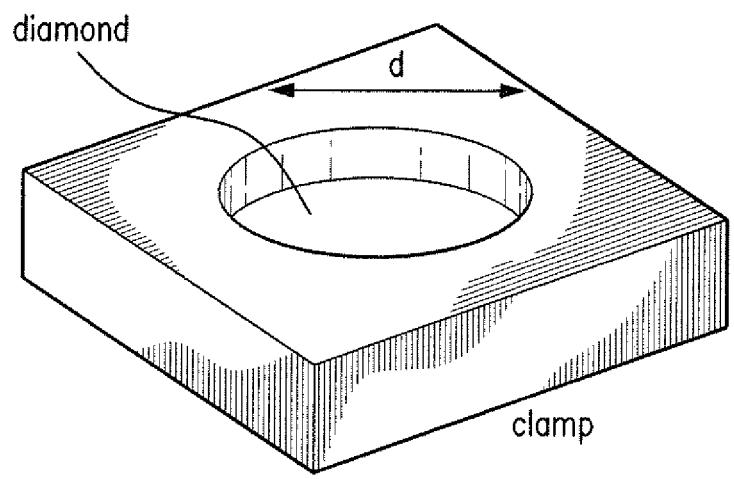
FIG. 8c depicts a diamond disk and a clamp in accordance with an embodiment of the disclosed subject matter.

For example, with reference to FIG. 7 and FIG. 8, a small temperature shift $\Delta\theta$, near $\theta_0$, can cause a diamond slab of length $L_d$ to expand by $\Delta L = L_d \eta_d \Delta\theta$. If the diamond slab were instead clamped, this expansion can be modulated. For example, Material 2 830, which forms the bottom of the clamp, can have a low thermal expansion coefficient and a high Young's modulus. Material 1 832, which forms the sides of the clamp, can have a high thermal expansion coefficient and a high Young's modulus. With varying temperature, a pressure $P=E_d\Delta L_d/L=E_d\in_d=E_d\Delta T\eta_d$ can be exerted to compress the diamond chip 835 by $-\Delta L$. For temperature changes $\sim 0.01$K, this pressure is approximately 12.2 kPa.

In connection with this embodiment, the different temperature dependences of NVCs in different orientations within the diamond chip can be used. NVCs can have one of four directions within the crystal structure. Anisotropic strain can be induced in the diamond chip, for example by patterning slits into the diamond chip. For example, the slits may be patterned using optical or electron beam lithography, followed by plasma etching with gasses such as oxygen or chlorine.

The single diamond chip system can be measured by creating a microwave field to measure the transient photoluminescence response of NVCs in one orientation, then measuring the response of NVCs in another orientation that will have a different temperature dependence.

The foregoing merely illustrates the principles of the disclosed subject matter. Various modifications and alterations to the described embodiments will be apparent to those skilled in the art in view of the teaching herein. It will thus be appreciated that those skilled in the art will be able to devise numerous techniques which, although not explicitly described herein, embody the principles of the disclosed subject matter and are thus within the spirit and scope of the disclosed subject matter.

The invention claimed is:

1. A method for obtaining a frequency standard using the crystal field splitting frequency of at least one nitrogen vacancy center in at least one diamond structure, comprising:
    applying a microwave field to the at least one diamond structure, the microwave field having a frequency initially equal to an initial frequency;
    optically exciting the at least one diamond structure to create photoluminescence having a photoluminescent characteristic based at least on the frequency of the microwave field;
    detecting at least a first measurement of the photoluminescent characteristic at the initial frequency;
    determining, based on the first measurement, a phase shift for the initial frequency from the constant crystal field splitting frequency of the at least one diamond structure;
    varying the frequency of the microwave field until a phase shift for the frequency of the microwave field from the constant crystal field splitting frequency is below a predetermined threshold; and
    using the frequency of the microwave field for which the phase shift is below the predetermined threshold as a frequency standard.

2. The method of claim 1, wherein the frequency of the microwave field is continuously monitored to prevent drift of the frequency standard.

3. The method of claim 1, further comprising surrounding the at least one diamond structure with a dielectric cavity prior to applying the microwave field to allow optical excitation at a lower output power.

4. The method of claim 1, wherein the optically exciting further comprises optically pumping the at least one diamond structure.

5. The method of claim 4, wherein detecting at least a first measurement further comprises continuously detecting measurements.

6. The method of claim 1, wherein the optically exciting further comprises continuously optically pumping the at least one diamond structure.

7. The method of claim 1, wherein the at least one diamond structure comprises a first and a second diamond structures, each having at least one nitrogen vacancy center, and
wherein the first measurement detecting further comprises simultaneously detecting a first measurement for the first diamond structure and a first measurement for the second diamond structure, to thereby stabilize the detected measurements with respect to temperature.

8. The method of claim 1, the at least one nitrogen vacancy having a temperature dependence, and further comprising controlling the temperate dependence of the at least one nitrogen vacancy center by engineered strain.

9. The method of claim 1, wherein the optically exciting further comprises applying pulsed emissions to excite the at least one nitrogen vacancy center.

10. The method of claim 9, wherein the at least one nitrogen vacancy center is optically excited prior to the microwave pulse emissions.

11. The method of claim 9, further comprising:
optically exciting the at least one nitrogen vacancy center with a pulse of light having a wavelength of 532 nm;
applying a $\pi/4$ microwave pulse;
waiting a time of period T;
applying a pi microwave pulse;
waiting a second time of period T;
applying a $\pi/4$ microwave pulse in the same phase as the first $\pi/4$ microwave pulse;
optically exciting the at least one nitrogen vacancy center with a pulse of light having a wavelength of 532 nm;
measuring the transient fluorescence response of the at least one nitrogen vacancy center; and
determining, from the transient fluorescence response, the phase shift of the applied microwave pulse from the crystal field splitting frequency of the at least one nitrogen vacancy center in the at least one diamond structure.

12. A system for obtaining a frequency standard using the crystal field splitting frequency of at least one nitrogen vacancy center in at least one diamond structure, comprising:
a dielectric cavity adapted to at least partially encompass the at least one diamond structure;
a light source, operatively configured to excite the at least one nitrogen vacancy, thereby allowing the at least one nitrogen vacancy center to produce a photoluminescent response;
a photodetector disposed proximal to the dielectric cavity and opposite the light source for detecting photoluminescence;
a stripline, disposed in the plane of and at least partially encompassing the at least one diamond structure, for applying microwave emissions having a frequency to the at least one diamond structure;
a processor, coupled to the photodetector and the stripline, to calculate the phase shift of the frequency of the microwave emissions from the crystal field splitting frequency of the at least one nitrogen vacancy center in the at least one diamond structure; and
a controller, coupled to the processor and the stripline, to adjust the frequency of the microwave emissions from the stripline based on the phase shift calculated by the processor until the phase shift is below a predetermined threshold, wherein the frequency for which the phase shift is below the predetermined threshold is a frequency standard.

13. The system of claim 12, wherein the photodetector comprises a silicon photodiode.

14. The system of claim 12, wherein the light source comprises a surface emitting laser adapted for generation of a doubled 1064 nm beam.

15. The system of claim 12, wherein the at least one diamond structure is coupled to a single clamp to thereby induce strain thereon.

16. The system of claim 12, wherein the dielectric cavity comprises a pair of Bragg reflectors to create a 532 nm resonant cavity.

17. The system of claim 16, wherein the pair of Bragg reflectors comprises one reflector placed on one face of the at least one diamond structure outside the plane of the stripline for applying microwave emissions, and further comprises the second Bragg reflector placed on the opposite face of the at least one diamond structure.

18. The system of claim 12, wherein the light source comprises a laser adapted to continuously irradiate the at least one diamond structure.

19. The system of claim 18, wherein the stripline comprises a microwave source adapted to apply microwave emissions continuously upon the at least one diamond structure.

20. The system of claim 12, wherein the light source comprises a laser adapted for generation of pulses for application to the at least one diamond structure.

21. The system of claim 20, wherein the stripline comprises a microwave source adapted for generation of pulsed emissions upon the at least one diamond structure.

22. The system of claim 12, wherein the at least one diamond structure comprises a first and a second diamond structures, each having at least one nitrogen vacancy center,
wherein the processor is further adapted for simultaneously detecting a first measurement for the first diamond structure and a first measurement for the second diamond structure, to thereby stabilize the detected measurements with respect to temperature.

23. The system of claim 22, further comprising a first substrate having a first thermal expansion coefficient and a second substrate having a second thermal expansion coefficient, wherein the first diamond structure is coupled to the first substrate and the second diamond structure is coupled to the second substrate, and wherein the first and second thermal expansion coefficients are different.

* * * * *